(12) United States Patent
Kikuchi et al.

(10) Patent No.: US 7,294,551 B2
(45) Date of Patent: Nov. 13, 2007

(54) SEMICONDUCTOR DEVICE AND METHOD FOR MANUFACTURING THE SAME

(75) Inventors: Shuichi Kikuchi, Gunma (JP); Eiji Nishibe, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/852,444

(22) Filed: May 24, 2004

(65) Prior Publication Data

US 2004/0212033 A1   Oct. 28, 2004

Related U.S. Application Data

(62) Division of application No. 09/943,667, filed on Aug. 31, 2001, now Pat. No. 6,963,109.

(30) Foreign Application Priority Data

Oct. 19, 2000   (JP) ............................ P2000-318806

(51) Int. Cl.
*H01L 21/336* (2006.01)
(52) U.S. Cl. ...................... 438/286; 438/307; 438/529; 438/530
(58) Field of Classification Search ........ 438/231–232, 438/286, 305–307, 527, 529–530; 257/335, 257/343, 492–493, E21.427, E29.256
See application file for complete search history.

(56) References Cited

U.S. PATENT DOCUMENTS 4,918,026 A * 4/1990 Kosiak et al. ............... 438/207
5,055,896 A   10/1991 Williams et al. ............ 257/409
5,171,700 A   12/1992 Zamanian .................... 438/305

(Continued)

FOREIGN PATENT DOCUMENTS

JP   7226505   8/1995

(Continued)

OTHER PUBLICATIONS

Wolf, Ph.D., Stanley, "Hot-Carrier-Resistant Processing and Device Structures," Silicon Processing for the VLSI Eral—vol. 3: The Submicron MOSFET, Lattice Press, 1995, pp. 588-590.*

(Continued)

*Primary Examiner*—Zandra V. Smith
*Assistant Examiner*—Toniae M Thomas
(74) *Attorney, Agent, or Firm*—Fish & Richardson P.C.

(57) ABSTRACT

A semiconductor device has a gate electrode formed on a P type semiconductor substrate via gate oxide films. A first low concentration (LN type) drain region is made adjacent to one end of the gate electrode. A second low concentration (SLN type) drain region is formed in the first low concentration drain region so that the second low concentration drain region is very close to the outer boundary of the second low concentration drain region and has at least a higher impurity concentration than the first low concentration drain region. A high concentration (N+ type) source region is formed adjacent to the other end of said gate electrode, and a high concentration (N+ type) drain region is formed in the second low concentration drain region having the designated space from one end of the gate electrode.

10 Claims, 3 Drawing Sheets

U.S. PATENT DOCUMENTS

| | | | | |
|---|---|---|---|---|
| 5,242,841 | A * | 9/1993 | Smayling et al. | 438/275 |
| 5,264,719 | A | 11/1993 | Beasom | 257/335 |
| 5,275,961 | A * | 1/1994 | Smayling et al. | 438/286 |
| 5,350,932 | A | 9/1994 | Malhi | 257/67 |
| 5,366,915 | A | 11/1994 | Kodama | 438/257 |
| 5,550,069 | A * | 8/1996 | Roth | 438/286 |
| 5,739,061 | A * | 4/1998 | Kitamura et al. | 438/275 |
| 5,780,893 | A * | 7/1998 | Sugaya | 257/318 |
| 5,789,787 | A | 8/1998 | Kadosh et al. | 257/369 |
| 5,811,850 | A | 9/1998 | Smayling et al. | 257/335 |
| 5,846,866 | A | 12/1998 | Huang et al. | 438/306 |
| 5,932,897 | A | 8/1999 | Kawaguchi et al. | 257/141 |
| 5,981,997 | A | 11/1999 | Kitamura | 257/335 |
| 6,017,798 | A | 1/2000 | Ilderem et al. | 438/286 |
| 6,025,237 | A | 2/2000 | Choi | 438/301 |
| 6,030,869 | A | 2/2000 | Odake et al. | 438/266 |
| 6,063,678 | A | 5/2000 | D'Anna | 438/301 |
| 6,107,129 | A | 8/2000 | Gardner et al. | 438/230 |
| 6,117,738 | A | 9/2000 | Tung | 438/286 |
| 6,198,131 | B1 | 3/2001 | Tung | 257/345 |
| 6,255,154 | B1 * | 7/2001 | Akaishi et al. | 438/217 |
| 6,258,674 | B1 * | 7/2001 | Kwon et al. | 438/286 |
| 6,306,711 | B1 * | 10/2001 | Yang | 438/286 |
| 6,307,224 | B1 | 10/2001 | Shirai | 257/288 |
| 6,392,274 | B1 | 5/2002 | Tung | 257/339 |
| 6,424,005 | B1 | 7/2002 | Tsai et al. | 257/335 |
| 6,465,315 | B1 | 10/2002 | Yu | 438/306 |
| 6,489,203 | B2 | 12/2002 | Cai et al. | 438/268 |
| 6,531,355 | B2 * | 3/2003 | Mosher et al. | 438/227 |
| 2002/0072186 | A1 * | 6/2002 | Evans | 438/306 |

FOREIGN PATENT DOCUMENTS

| | | | |
|---|---|---|---|
| JP | 10098183 | | 4/1998 |
| JP | 11163336 | | 6/1999 |
| JP | 11-312802 | * | 11/1999 |

OTHER PUBLICATIONS

Wolf, Stanley, Hot Carrier-Resistant Processing and Device Structures, Silicon Processing for the VLSI Era vol. 3—The Submicron MOSFET, Lattice Press (1995); pp. 617-621.

Webster's II New Riverside University Dictionary, Houghton Mifflin Company (1994); p. 78.

* cited by examiner

SEMICONDUCTOR DEVICE AND METHOD FOR MANUFACTURING THE SAME

CROSS-REFERENCE TO RELATED APPLICATION(S)

This application is a divisional of U.S. Ser. No. 09/943,667, filed Aug. 31, 2001 now U.S. Pat. No. 6,963,109, which is incorporated by reference herein.

BACKGROUND OF THE INVENTION

1. Field of the Invention

The present invention relates to a semiconductor device and a method for manufacturing the semiconductor device, particularly to a technique of improving withstanding operating voltage.

2. Description of the Related Art

FIG. 5 is a sectional view describing a conventional semiconductor device.

In FIG. 5, symbol 51 refers to a first conductive P type semiconductor substrate. On the substrate 51, a gate electrode 53 is formed through a gate oxide film 52, and a source-drain region of a one-sided LDD (Lightly Doped Drain) structure is formed adjacent to the gate electrode 53. That is, this semiconductor device has a source-drain region of the one-sided LDD structure. A high concentration (N+ type) source region 55 is formed at the source region side adjacent to the gate electrode 53, a low concentration (N− type) drain region 54 is formed at the drain region side adjacent to said gate electrode 53, and a high concentration (N+ type) drain region 56 is formed in the low concentration drain region 54.

As described above, in the semiconductor device of the one-sided LDD structure in which a high voltage is applied only to the drain region side, the high concentration drain region 56 is surrounded by the low concentration drain region 54 to defuse concentration of electric field in the drain region side, as mentioned above. However, in the source region side, only the high concentration source region 55 exists.

Even the semiconductor device having such a structure is needless to take its structure as a particular problem with regard to static withstanding voltage. However, at operation, the following problem occurs.

That is, in a bipolar structure consisting of a source region (emitter region), a substrate (base region), and a drain region (collector region), injection efficiency of carrier is good because a high concentration source region 55 is exposed in emitter region, so that the bipolar structure can be made easily by a little substrate current Isub.

That is, since current gain β in the bipolar structure with a one-sided LLD structure is high, the drain withstanding voltage during operation decreases compared with a semiconductor device of a double-sided LDD structure.

Here, in order to improve the drain withstanding voltage during operation, the substrate current Isub needs to be decreased. That is, the electric field must be made weak.

However, when an impurity concentration of the entire low concentration drain region 54 is decreased in order to decrease the substrate current Isub, the substrate current Isub has a double hump structure having two peaks ((1) and (2)) as voltage Vg increases, as shown in FIG. 6.

When the low concentration drain region 54 is further decreased, the first peak (1) of the substrate current Isub is low so that the drain withstanding voltage at low Vgs improves. However, the second peak (2) of the substrate current Isub is comparatively high so that drain withstanding voltage at high Vgs decreases.

Conversely, when the entire impurity concentration of the low concentration drain region 54 is high, a single peak at a certain voltage Vgs appears and the drain withstanding voltage at high Vgs decreases, as shown in FIG. 6. However, there is a problem that the drain withstanding voltage at low Vgs can not withstand.

Thus, when the entire impurity concentration of the low concentration drain region 54 is changed uniformly, the change can not overcome the trade-off relationship of the drain withstanding voltage at low Vgs and the drain withstanding voltage at high Vgs.

Although current gain β decreases and the withstanding voltage withstands decidedly by adopting a double-sided LDD structure, the device has distance (L) of a drift region similar to the drain side shown in FIG. 5. In this instance, the on-resistance increases and the driving ability decreases because a usual LDD structure is adopted at the source side, although the withstanding voltage at the source side is not needed.

SUMMARY OF THE INVENTION

The invention is a semiconductor device comprising: a gate electrode formed on a first conductive type semiconductor substrate via a gate oxide film; a first low concentration drain region of a second conductive type, being formed adjacent to one end of the gate electrode; a second low concentration drain region of the second conductive type, being formed in the first low concentration drain region so that the second low concentration drain region is very close to the outer boundary of the first low concentration drain region, and being higher in impurity concentration than at least impurity concentration of the first low concentration drain region; and a high concentration source region of the second conductive type being formed adjacent to another end of the gate electrode and a high concentration drain region of the second conductive type being formed in the low concentration drain region having a predetermined distance from the one end of the gate electrode.

A method for manufacturing a semiconductor device comprises: a first process comprising steps of a first step forming a first photo resist film having a first opening at a drain forming region on a first conductive type semiconductor substrate, a second step ion-implanting a first impurity of the second conductive type and a second impurity of the second conductive type with the first photo resist film being used as a mask, and a third step forming a first low concentration drain region of the second conductive type and a second low concentration drain region of second type by diffusing the first impurity and the second impurity after the fore-mentioned ion-implanting step; a second process forming an element separation film at a predetermined region by selectively oxidizing with an oxidization resist film formed on the substrate as a mask and forming a second gate oxide film at region except the element separation film and the first gate oxide film; a third process forming a gate electrode so as to cover from the first gate oxide film to the second gate oxide film; a fourth process forming a second photo resist film having a second opening on the source forming region on the substrate and having a third opening on a region separated from another end of the gate electrode on the low concentration drain region; and a fifth process forming high concentration source-drain regions of the second conductive type by ion-implanting a third impurity of the second conductive type on the substrate with the second photo resist film, the gate electrode, the element separation film, and the first gate oxide film as a mask.

Thus, the second low concentration drain region higher in impurity concentration than impurity of the first low concentration drain region is formed in the first low concentration drain region of second conductive type so that the second low concentration drain region is very close to the outer boundary of the first low concentration drain region. By that, the low concentration drain region is made with a double structure consisting of two kinds of impurity ions different in diffusion coefficient without uniformly changing impurity distribution in the low concentration drain region. Therefore, the first low concentration drain region withstands low Vgs withstanding voltage, and the second low concentration drain region withstands high Vgs withstanding voltage.

Further, the process forming the first low concentration drain region and second low concentration drain region have a process thermal-treating, at the same time, the first impurity consisting of phosphorus ion and the second impurity consisting of arsenic ion and use difference of diffusion coefficients of these impurities.

Thus, since difference of diffusion coefficients of two kinds of impurities is used and these impurities are formed at the same process when the first low concentration drain region and the second low concentration drain region are formed, the second low concentration drain region can be formed accurately at very near part in the first low concentration drain region.

DESCRIPTION OF THE PREFERRED EMBODIMENTS

An embodiment of a semiconductor device of the present invention and a method for manufacturing the semiconductor device according to the present invention will be described referring to figures.

Figure 4:
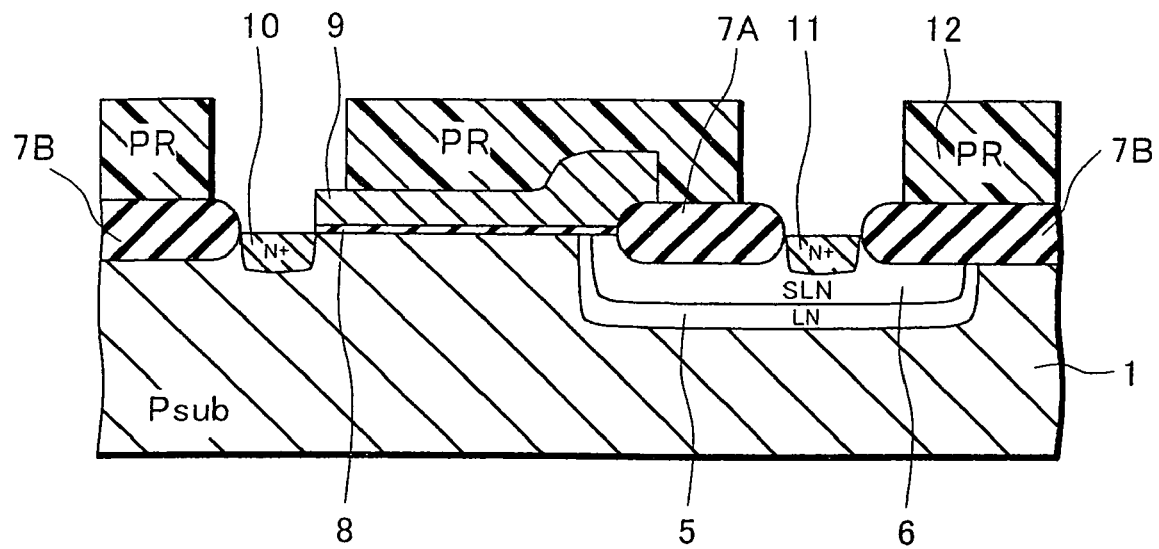
FIG. 4 is a sectional view showing a method for manufacturing a semiconductor device according to an embodiment of the invention.
Figure 5:
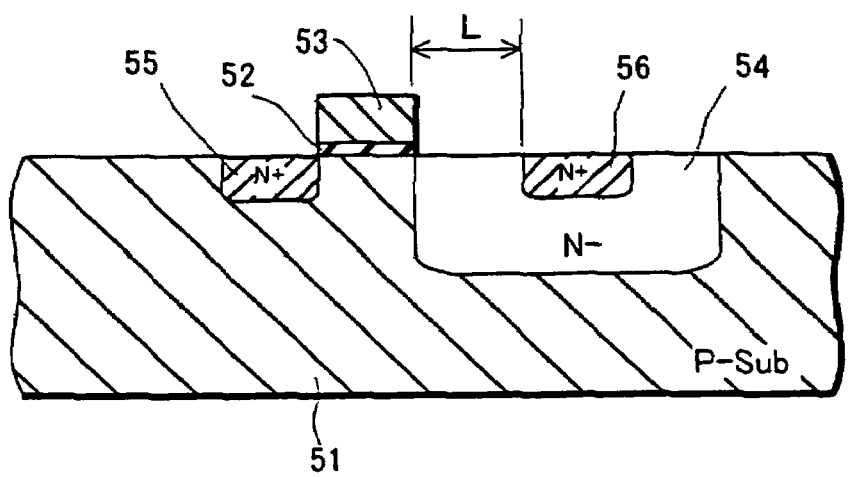
FIG. 5 is a sectional view showing a conventional semiconductor device.
Figure 6:
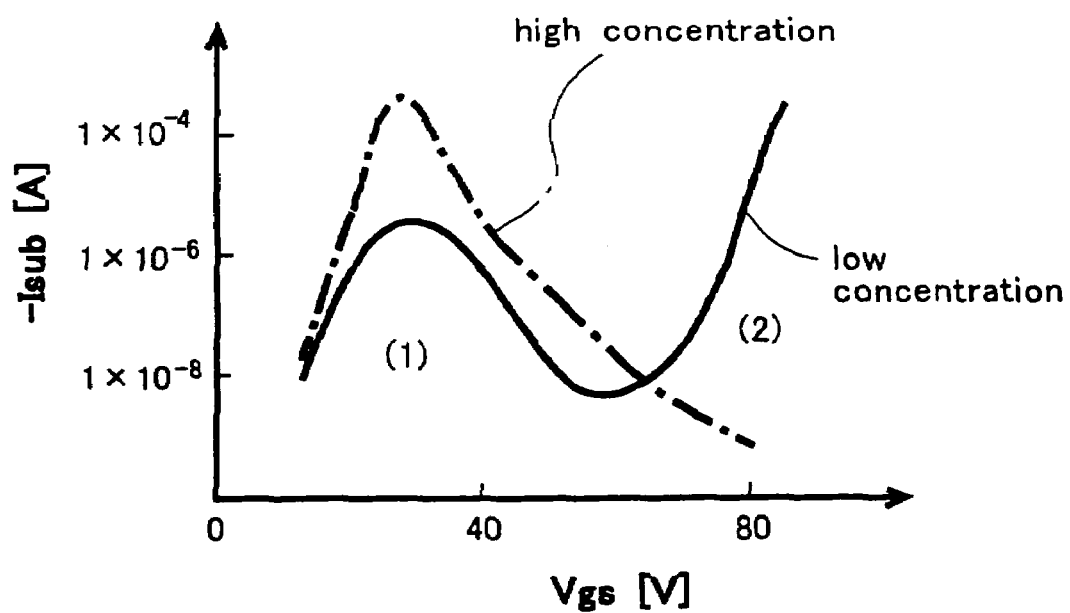
FIG. 6 graphically shows a problem in connection with the device shown in FIG. 5.

In a semiconductor device according to the invention, a gate electrode 9 is formed on a P type substrate, for example, a semiconductor substrate 1 and disposed over from a first gate oxide film 7A to a second gate oxide film 8, as shown in FIG. 4.

A high concentration (N+ type) source region 10 is formed adjacent to one end of the gate electrode 9 (one end of the second gate oxide film 8). Further, a first low concentration (LN type) drain region 5 is formed adjacent to the other end of the gate electrode 9 (the other end of the first gate oxide film 7A) A second low concentration (SLN type) drain region 6 at least higher in impurity concentration than the first low concentration (LN type) drain region 5 is formed in the first low concentration (LN type) drain region 5 so that the second low concentration drain region 6 is very close to the outer boundary of the first low concentration drain region 5. Further in the drain region 6, a high concentration (N+ type) drain region 11 is formed at a region separated from the gate electrode 9 (so as to be adjacent to one end of the first gate oxide film 7A).

Thus, the second low concentration (SLN type) drain region 6 higher in impurity concentration than the first low concentration (LN type) drain region 5 is formed in the first low concentration (LN type) drain region so that the second low concentration drain region 6 is very close to the outer boundary of the first low concentration drain region 5. By that, a low concentration drain region is made with a double structure consisting of two kinds of impurity ions differing in diffusion coefficient. That is, the drain region has the second low concentration (SLN type) drain region 6 thinly covering the first low concentration (LN type) drain region 5, without changing uniformly the impurity distribution in the low concentration drain region. Therefore, the first low concentration (LN type) drain region 5 withstands a low Vgs withstanding voltage, and the second low concentration (SLN type) drain region 6 withstands a high Vgs withstanding voltage to improve the drain withstanding voltage during operation.

Thus, by the construction of the low concentration drain region with two or more kinds of different impurity concentrations, and by not changing the impurity distribution uniformly over the entire low concentration drain regions, the drain withstanding voltage during operation can be improved independent of the trade-off relationship of drain withstanding voltage at low Vgs and the drain withstanding voltage at high Vgs.

Because there is no need to adopt the conventional semiconductor device of the LDD structure having substantially symmetrical low concentration source-drain regions in the source-drain regions and because the device according to the present invention does not have a drift region compared with the conventional semiconductor device, the driving ability is not suppressed.

A method for manufacturing the above-mentioned semiconductor device will be described below referring to the figures.

Figure 1:
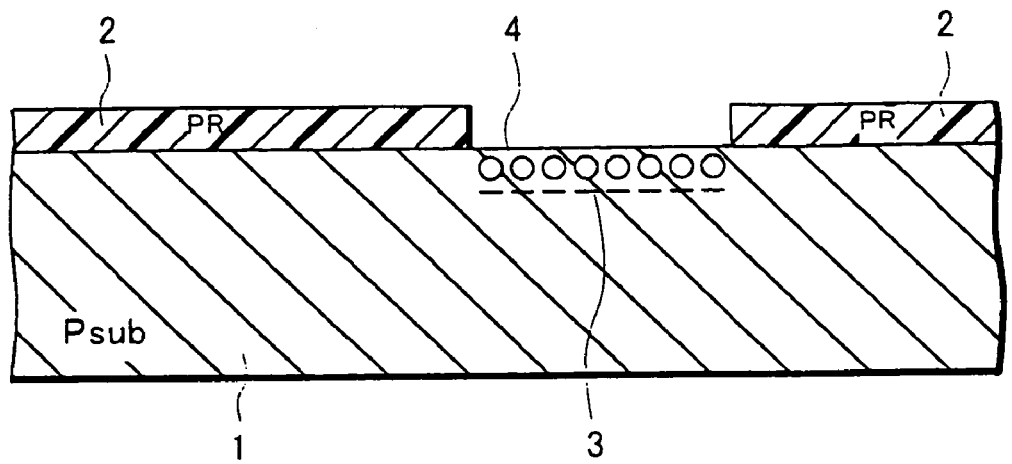
FIG. 1 is a sectional view showing a method for manufacturing a semiconductor device according to an embodiment of the invention.

First, in FIG. 1, a photo resist (PR) film 2 having an opening on a drain forming region on a P type semiconductor substrate 1 is formed, while using the photo resist (PR) film 2 as a mask. First and second impurity implantation regions are formed by ion-implanting first and second impurities. The second impurity is required to have a diffusion coefficient less than the first impurity. If the first impurity is phosphorus-ion, the second impurity can be arsenic-ion, for example. After a first impurity implantation region 3 is formed by ion-implanting phosphorus-ions with an acceleration voltage of 100 KeV at a dose of about $6 \times 10^{12}/cm^2$, a second impurity region 4 is formed by ion-implanting arsenic-ions with an acceleration voltage of 160 KeV at a dose of about $5 \times 10^{11}/cm^2$.

Figure 2:
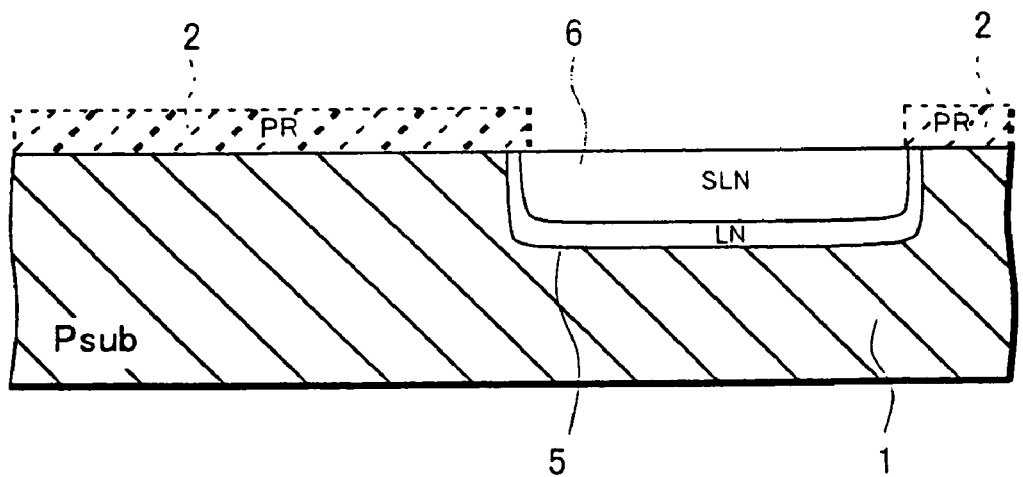
FIG. 2 is a sectional view showing a method for manufacturing a semiconductor device according to an embodiment of the invention.

Next, in FIG. 2, after removing the photo resist film 2, a first low concentration (LN type) drain region 5 is formed by thermally diffusing the phosphorus ions and arsenic ions. A second low concentration (SLN) drain region 6 with higher impurity concentration than at least the low concentration drain region 5 is formed in the low concentration drain region so that the second low concentration drain region 6 is very close to the outer boundary of the first low concentration drain region 5. At this time, a thermal treatment of about 1100° C. and 4 hours is carried out.

In the process, two kinds of impurity ions (phosphorus and arsenic) having different diffusion coefficients are ion-implanted using the same mask (photo resist film 2) and diffused using the difference in diffusion coefficients. Thus, the second low concentration (SLN type) drain region 6 with comparatively high impurity concentration can be formed with the thin first low concentration (LN type) drain region 5 suitably spaced apart.

Figure 3:
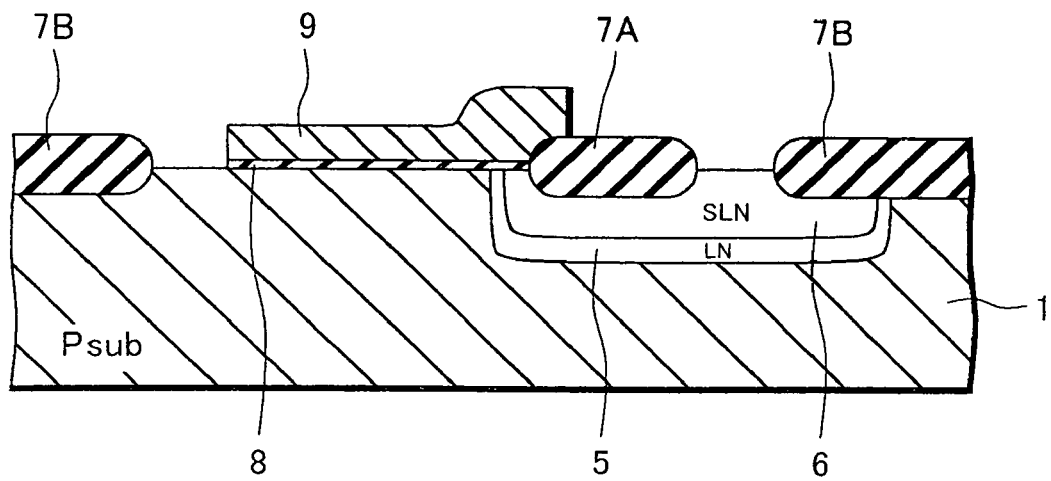
FIG. 3 is a sectional view showing a method for manufacturing a semiconductor device according to an embodiment of the invention.

Next, in FIG. 3, after forming a pad oxide film and a silicon nitride film as an oxidation resistance film having an opening at the designated region (a first gate oxide film forming region and an element separation film forming region) not shown on the substrate 1, a first gate oxide film 7A and an element separation film 7B of about 1000 nm thickness are formed by using the silicon nitride film as a mask and oxidizing the oxidation resistance film selectively by a known LOCOS method. Further, after removing the pad oxide film and silicon nitride film, a second gate oxide film 8 of 150 nm thickness is formed by thermal-oxidizing the substrate where the first gate oxide film 7A and element separation film 7B are not formed. Then, after a polysilicon film of 400 nm thickness is formed on the substrate 1 and a conducting treatment of the polysilicon film is carried out, a gate electrode 9 is formed to dispose over from the first gate oxide film 7A to the second gate oxide film 8, patterning a photo resist film, not shown, which is used as a mask. At this time, the second gate oxide film 8 on the substrate 1 except the part where the gate electrode 9 is formed is removed.

Further, in FIG. 4, an N type impurity is ion-implanted to be adjacent to one end of the gate electrode 9 using a photo resist (PR) film 12 formed on the substrate 1 as a mask. An ion-implanting N type impurity is also deposited at the other end of the gate electrode 9 to be adjacent to one end of the gate oxide film 7A. That is, a high concentration (N+ type) source region 10 is formed to be adjacent to one end of the gate electrode 9. Then, a high concentration (N+ type) drain region 11 is formed at a region separated from the other end of the gate electrode 9 (to be adjacent to the other end of the first gate oxide film 7A) in the second low concentration drain region 6. At this time, arsenic ions are ion-implanted with an acceleration voltage of about 80 KeV at a dose of about $6 \times 10^{15}/cm^2$.

Although description shown in the figure is omitted, source-drain electrodes are formed through contact holes after forming an insulation film between layers over whole surface forming the contact holes on the insulation film between layers to make contact with the source-contact regions.

Thus, in the method for manufacturing the semiconductor device of the present invention, two kinds of impurities (phosphorus and arsenic), which are ion-implanted previously on the surface of the substrate and have different diffusion coefficients, are treated thermally to induce diffusion. Using the difference in the diffusion coefficients, a low concentration drain region of a double structure having two kinds of impurity concentration is formed. That is, the low concentration drain region is formed to cover thinly the second low concentration (SLN type) drain region 6 (based on arsenic ions) with the first low concentration (LN type) drain region 5 (based on phosphorus ions). Therefore, in contrast to changing impurity concentration uniformly over the whole low concentration drain regions, the drain withstanding voltage during operation can be improved independent of any trade-off relationship of drain withstanding voltage at a low Vgs and drain withstanding voltage at a high Vgs.

According to the invention, by forming a low concentration drain region to have two kinds of different impurity concentrations, the low Vgs withstanding voltage withstands at the first low concentration drain region, and the high Vgs withstanding voltage withstands at the second low concentration drain region so as to improve the drain withstanding voltage characteristics during operation.

The first low concentration drain region and the second low concentration drain region are formed by thermally treating the two kinds of implanted impurities having different diffusion coefficients. Thus, the second low concentration drain can be formed in the first low concentration drain region so that the second low concentration drain is very close to the outer boundary of the first low concentration drain region.

What is claimed is:

1. A method for manufacturing a semiconductor device comprising a high concentration source region of a second conductive type formed adjacent to one end of a gate electrode which is formed on a first conductive type semiconductor substrate via a gate oxide film, a low concentration drain region of the second conductive type formed near another end of the gate electrode, and a high concentration drain region formed in the low concentration drain region such that the low concentration drain region extends beneath the entire high concentration drain region and the high concentration drain region is laterally spaced away from the gate electrode,
   wherein a forming process of said low concentration drain region comprises:
   ion-implanting at least two kinds of second conductive type impurities, each of said impurities having a diffusion coefficient different from each other, through the same mask, wherein the mask prevents ion-implantation of the at least two kinds of second conductive type impurities in the source region; and
   diffusing said impurities.

2. A method for manufacturing a semiconductor device comprising:
   a first process comprising steps of:
   a first step comprising forming a first photo resist film that masks a source forming region and that has a first opening at a drain forming region on a first conductive type semiconductor substrate,
   a second step comprising ion-implanting a first impurity of a second conductive type and a second impurity of the second conductive type with the first photo resist film being used as a mask, and
   a third step comprising forming a first low concentration drain region of the second conductive type and a second low concentration drain region of second type by diffusing said first impurity and said second impurity after the fore-mentioned ion-implanting step;
   a second process comprising forming an element separation film at a predetermined region by selectively oxidizing with an oxidization resist film formed on said substrate as a mask and forming a second gate oxide film at region except the element separation film and a first gate oxide film;
   a third process comprising forming a gate electrode so as to cover from said first gate oxide film to the second gate oxide film;
   a fourth process comprising forming a second photo resist film having a second opening on a source forming region on said substrate and having a third opening on a region separated from another end of said gate electrode on said low concentration drain regions; and a fifth process comprising forming high concentration source-drain regions of the second conductive type by ion-implanting a third impurity of the second conductive type on said substrate with said second photo resist film, said gate electrode, said element separation film, and said first gate oxide film as a mask.

3. A method for manufacturing a semiconductor device according to claim 2,
wherein said process forming said first low concentration drain region and second low concentration drain region uses two kinds of second conductive type impurities and each of said second type impurities has a diffusion coefficient different from each other.

4. A method for manufacturing a semiconductor device according to claim 2,
wherein the process forming said first low concentration drain region and second low concentration drain region is a process thermal-treating, at the same time, said first impurity consisting of phosphorus ion and said second impurity consisting of arsenic ion, and uses difference of diffusion coefficients of these impurities.

5. The method of claim 1 wherein ion-implanting at least two kinds of second conductive type impurities includes:
ion-implanting a first one of the second conductive type impurities at a first acceleration voltage; and
ion-implanting a second one of the second conductive type impurities at a second acceleration voltage higher than the first acceleration voltage,
wherein the second one of the second conductive type impurities has a diffusion coefficient lower than the first one of the second conductive type impurities.

6. The method of claim 5 wherein the first one of the second conductive type impurities comprises phosphorous and the second one of the second conductive type impurities comprises arsenic.

7. The method of claim 5 including diffusing the impurities so that the low concentration drain region includes a first part having an impurity concentration lower than a second part, wherein the first part surrounds the second part.

8. The method of claim 1 including forming the high concentration source region and the high concentration drain region.

9. The method of claim 1 wherein forming the gate oxide film comprises forming a first gate oxide film laterally adjacent to the high concentration drain region using a LOCOS method.

10. A method for manufacturing a semiconductor device comprising a high concentration source region of a second conductive type formed adjacent to one end of a gate electrode which is formed on a first conductive type semiconductor substrate via a gate oxide film, a low concentration drain region of the second conductive type formed near another end of the gate electrode, and a high concentration drain region formed in the low concentration drain region such that the low concentration drain region extends beneath the entire high concentration drain region and the high concentration drain region does not extend beneath the gate electrode,
wherein a forming process of said low concentration drain region comprises:
ion-implanting at least two kinds of second conductive type impurities, each of said impurities having a diffusion coefficient different from each other, through the same mask, wherein the mask prevents ion-implantation of the at least two kinds of second conductive type impurities in the source region; and diffusing said impurities.

* * * * *